United States Patent
Ganihar

(10) Patent No.: US 11,443,079 B2
(45) Date of Patent: Sep. 13, 2022

(54) SYSTEM AND METHOD FOR GENERATING AND VISUALIZING AN INTERIOR DESIGN IN A THREE-DIMENSIONAL REPRESENTATION

(71) Applicant: SNAPTRUDE TECHNOLOGIES PRIVATE LIMITED, Bengaluru (IN)

(72) Inventor: Syed Altaf Hussain Ganihar, Bengaluru (IN)

(73) Assignee: SNAPTRUDE INC., Lewes, DE (US)

(*) Notice: Subject to any disclaimer, the term of this patent is extended or adjusted under 35 U.S.C. 154(b) by 210 days.

(21) Appl. No.: 16/967,524

(22) PCT Filed: Dec. 8, 2018

(86) PCT No.: PCT/IB2018/059799
§ 371 (c)(1),
(2) Date: Aug. 5, 2020

(87) PCT Pub. No.: WO2019/155276
PCT Pub. Date: Aug. 15, 2019

(65) Prior Publication Data
US 2021/0232719 A1    Jul. 29, 2021

(30) Foreign Application Priority Data
Feb. 8, 2018    (IN) .............................. 201841004892

(51) Int. Cl.
*G06F 30/13*    (2020.01)
*G06T 19/20*    (2011.01)
*G06T 17/10*    (2006.01)

(52) U.S. Cl.
CPC .............. *G06F 30/13* (2020.01); *G06T 17/10* (2013.01); *G06T 19/20* (2013.01); *G06T 2210/04* (2013.01)

(58) Field of Classification Search
None
See application file for complete search history.

(56) References Cited

U.S. PATENT DOCUMENTS

| | | | |
|---|---|---|---|
| 9,153,062 B2* | 10/2015 | Dorsey ................. | G06T 15/005 |
| 9,754,166 B2* | 9/2017 | Ludwigsen ............ | G06V 10/40 |
| 2013/0222385 A1* | 8/2013 | Dorsey ................. | G06T 15/005 |
| | | | 345/427 |
| 2017/0161558 A1* | 6/2017 | Ludwigsen ............... | G06T 1/00 |

* cited by examiner

*Primary Examiner* — Kent W Chang
*Assistant Examiner* — Jonathan M Cofino
(74) *Attorney, Agent, or Firm* — Dave Law Group LLC; Raj S. Dave

(57) ABSTRACT

The present disclosure provides systems and methods for generating an interior design pertaining to a floor plan and creating a three-dimensional (3D) representation of the interior design for achieving high quality interior décor for residential as well as commercial properties. An aspect of the present disclosure pertains to a system for generating and visualizing the interior design in the 3D representation that includes a two-dimensional image receive module to receive a two-dimensional input image of the floor plan, a shape determination module to determine shape of a defined space of the floor plan, an object position determination module to determine position of one or more objects in the defined space, an object placement module to place the one or more objects in the defined space, and a three-dimensional representation generation module to generate a 3D representation of the interior design pertaining to the floor plan.

10 Claims, 9 Drawing Sheets

SYSTEM AND METHOD FOR GENERATING AND VISUALIZING AN INTERIOR DESIGN IN A THREE-DIMENSIONAL REPRESENTATION

CROSS-REFERENCE TO RELATED APPLICATIONS

This application is the National Stage Entry of PCT/IB2018/059799 filed on Dec. 8, 2018, which claims priority to the Indian Application No. 201841004892, filed on Feb. 8, 2018, the entire disclosures of which are incorporated herein by reference as part of the disclosure of this application.

TECHNICAL FIELD

The present disclosure relates to the field of interior designing and more particularly provides systems and methods for generating an interior design pertaining to a floor plan followed by creating a three-dimensional representation of the interior design for achieving high quality interior décor for residential as well as commercial properties.

BACKGROUND

Background description includes information that may be useful in understanding the present disclosure. It is not an admission that any of the information provided herein is prior art or relevant to the presently claimed invention, or that any publication specifically or implicitly referenced is prior art.

Enhancing the interiors of any space to develop a safe and aesthetically pleasing environment is achieved by art of interior design. The pursuit of effective use of space and functional design has contributed to the development of interior design. However, the field of interior design is constantly evolving. Typically, interior designers are required to be highly skilled to create effective interior environments and are generally required to be aware of building codes and inspection regulations, as well as universal accessibility standards. In most cases, the designs for particular spaces are typically dependent on the skill of the interior designer. Based on the size of the space and the skill of the interior designer, the interior designing process can be time consuming and substantially expensive.

Currently, several interior design techniques are available that facilitate interior designing. For example, software such as RoomSketcher™ and Homestyler™ allow a user to visualize interior design of a space. Most of the existing online interior design tools and techniques facilitate the process of generating ideas for the functional and aesthetic possibilities of the space and to create illustrations and renderings for the space. For example, a known technique pertains to a system for providing interior design by allowing a user to enter interior design requirements. The said system selects interior design treatments according to the user's design requirements so that a grouping of compatible interior design treatments can be provided for the user to be used in décor.

However, existing techniques are currently not fully automated and may not utilize information such as scientific ergonomic database for establishing design criteria and design parameters for a space. Moreover, such tools are restricted to specific visualization platforms.

Therefore, there is need in the art to develop techniques pertaining to interior designing that can provide a generation of an interior design layout based on input image of a floor plan. Further, there is a need in the art to develop techniques pertaining to interior designing that are time effective and can provide layouts that are not specific to any visualization platform.

OBJECTS OF THE PRESENT DISCLOSURE

Some of the objects of the present disclosure, which at least one embodiment herein satisfies are as listed herein below.

It is a general object of the present disclosure to provide system and method for generating and visualizing an interior design pertaining to a floor plan in a three-dimensional representation.

It is an object of the present disclosure to provide system and method for generating and visualizing an interior design pertaining to a floor plan in a three-dimensional representation based on techniques that are time effective and less cumbersome.

It is another object of the present disclosure to provide system and method for generating and visualizing an interior design pertaining to a floor plan in a three-dimensional representation that provides enhanced performance and reliability as compared to existing solutions.

It is an object of the present disclosure to provide system and method for generating and visualizing an interior design pertaining to a floor plan in a three-dimensional representation that can allow user-based customization.

These and other objects of the present invention will become readily apparent from the following detailed description taken in conjunction with the accompanying drawings.

SUMMARY

The present disclosure provides systems and methods for generating an interior design pertaining to a floor plan followed by creating a three-dimensional representation of the interior design for achieving high quality interior décor for residential as well as commercial properties.

An aspect of the present disclosure pertains to a system for generating and visualizing an interior design pertaining to a floor plan in a three-dimensional representation, the system comprising: a non-transitory storage device having embodied therein one or more routines operable to generate and represent the interior design in three-dimensional representation of the interior design pertaining to the floor plan; and one or more processors coupled to the non-transitory storage device and operable to execute the one or more routines, wherein the one or more routines include: a two-dimensional image receive module, which when executed by the one or more processors, receives a two-dimensional input image pertaining to the floor plan, wherein the floor plan comprise at least one defined space; a shape determination module, which when executed by the one or more processors, determines a bounded region of the at least one defined space by performing region expansion based on Fast Library for Approximate Nearest Neighbors (FLANN) based range search emanating from a seed point pertaining to the at least one defined space and determines shape of the at least one defined space by filling plurality of pixels of the bounded region with a reference pixel value and performing geometric extraction of the bounded region based on contour detection; an object position determination module, which when executed by the one or more processors, computes one or more parameters of the at least one defined space and determines position of one or more objects in the at least one defined space based on the one or more parameters and annotation of the at least one defined space, wherein the position of the one or more objects is determined based on a set of pre-determined design assumptions obtained using neural networks; an object placement module, which when executed by the one or more processors, places the one or more objects from a pre-built library according to the determined position of the one or more objects in the at least one defined space, wherein the placement of the one or more objects is based on developing Gaussian normal distributions based on any or a combination of dimensions of the one or more objects and dimensions of the at least one defined space; and a three-dimensional representation generation module, which when executed by the one or more processors, generates a three-dimensional representation of the interior design pertaining to the floor plan based on placement of the one or more objects in the at least one defined space.

In an embodiment, the two-dimensional image receive module receives any or a combination of the annotation and the seed point pertaining to the at least one defined space.

In an embodiment, the shape determination module processes the two-dimensional input image to obtain a binary image, wherein determination of the bounded region is performed based on the binary image.

In an embodiment, in case the bounded region is not determined by performing determination of the bounded region based on the two-dimensional input image, the shape determination module performs said determination based on the binary image.

In an embodiment, the shape determination module fixes convexity defects of the at least one defined space by computing convex hulls.

In an embodiment, the one or more parameters include any or a combination of size of the at least one defined space, lengths of edges of the at least one defined space, location of the at least one defined shape in the floor plan, position of connectives in the at least one defined space and cardinal directions.

In an embodiment, the object position determination module fetches the set of pre-determined design assumptions from a design engine.

In an embodiment, the system further comprises an object optimization module to perform optimization of the one or more attributes of the one or more objects, wherein the one or more attributes comprise any or a combination of geometric attributes, optical attributes and structural attributes of the one or more objects.

In an embodiment, the system further comprises an interactive visualization and editor module to allow a user to modify the generated three-dimensional representation of the interior design Another aspect of the present disclosure pertains to a method comprising the steps of: receiving, by one or more processors, a two-dimensional input image pertaining to the floor plan, wherein the floor plan comprise at least one defined space; determining, by the one or more processors, a bounded region of the at least one defined space by performing region expansion based on Fast Library for Approximate Nearest Neighbors (FLANN) based range search emanating from a seed point pertaining to the at least one defined space; determining, by the one or more processors, shape of the at least one defined space by filling plurality of pixels of the bounded region with a reference pixel value and performing geometric extraction of the bounded region based on contour detection; computing, by the one or more processors, one or more parameters of the at least one defined space and determining position of one or more objects in the at least one defined space based on the one or more parameters and annotation of the at least one defined space, wherein the position of the one or more objects is determined based on a set of pre-determined design assumptions obtained using neural networks; placing, by the one or more processors, the one or more objects from a pre-built library according to the determined position of the one or more objects in the at least one defined space, wherein the placement of the one or more objects is based on developing Gaussian normal distributions based on any or a combination of dimensions of the one or more objects and dimensions of the at least one defined space; and generating, by the one or more processors, a three-dimensional representation of the interior design pertaining to the floor plan based on placement of the one or more objects in the at least one defined space.

Various objects, features, aspects and advantages of the inventive subject-matter will become more apparent from the following detailed description of preferred embodiments, along with the accompanying drawing figures in which like numerals represent like components.

BRIEF DESCRIPTION OF THE FIGURES

In the figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION

Figure 1:
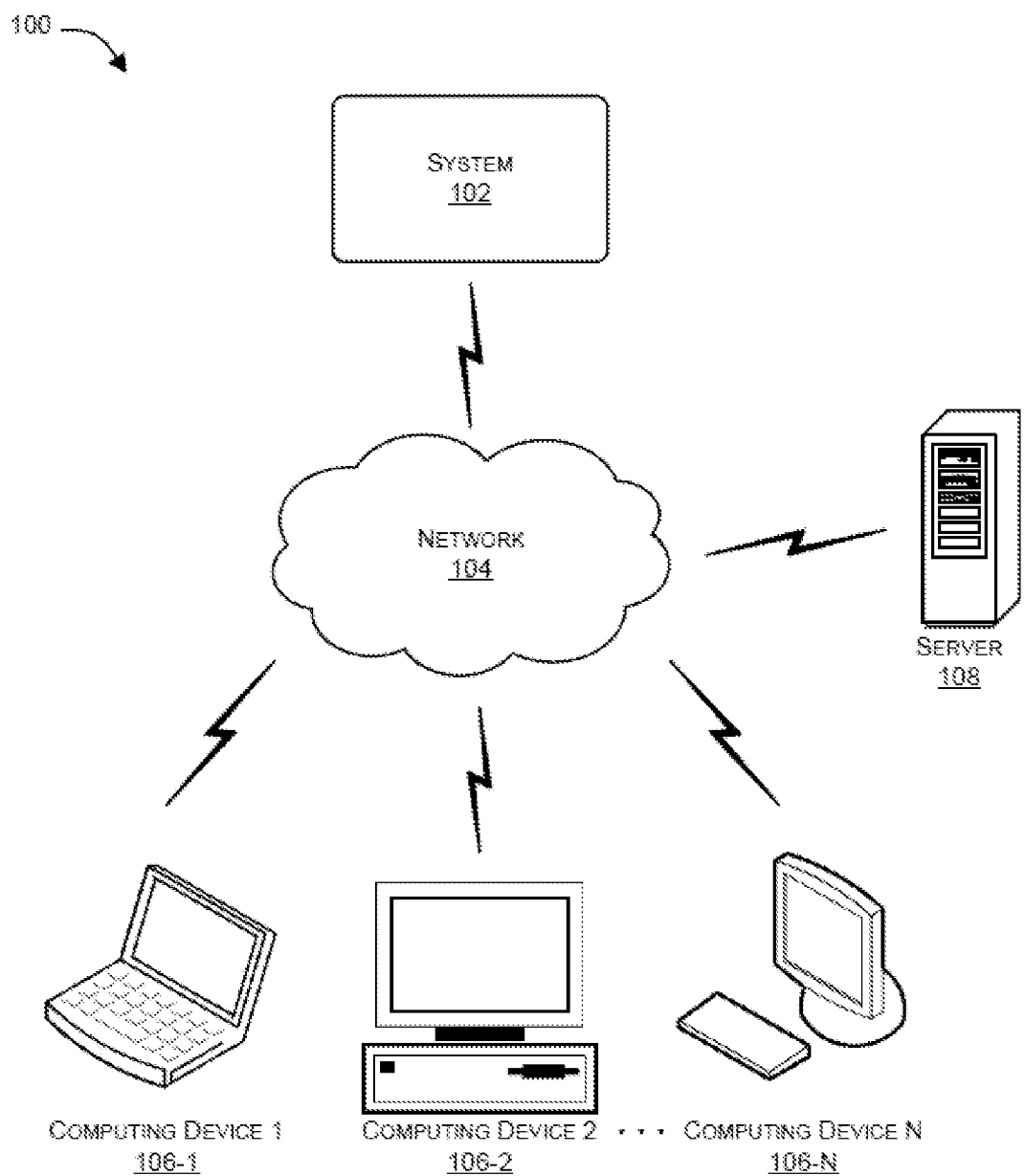
FIG. 1 illustrates exemplary architecture of system for generating and visualizing an interior design pertaining to a floor plan in a three-dimensional representation in accordance with an embodiment of the present disclosure.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in many alternate forms and should not be construed as limited to only the example embodiments set forth herein.

Accordingly, while example embodiments are capable of various modifications and alternative forms, example embodiments are shown by way of example in the drawings and will herein be described in detail. It should be understood, however, that there is no intent to limit example embodiments to the particular forms disclosed. On the contrary, example embodiments are to cover all modifications, equivalents, and alternatives thereof. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. Inventive concepts may, however, be embodied in many alternate forms and should not be construed as limited to only the example embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Further, although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the scope of inventive concepts.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular example embodiments only and is not intended to be limiting. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" may encompass both an orientation of above and below. The device may be otherwise oriented (rotated 90 degrees or at other orientations) and the spatially relative descriptors used herein are interpreted accordingly.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

The system(s)/method(s), described herein, may be realized by hardware elements, software elements and/or combinations thereof. For example, the devices and components illustrated in the example embodiments of inventive concepts may be implemented in one or more general-use computers or special-purpose computers, such as a processor, a controller, an arithmetic logic unit (ALU), a digital signal processor, a microcomputer, a field programmable array (FPA), a programmable logic unit (PLU), a microprocessor or any device which may execute instructions and respond. A central processing unit may implement an operating system (OS) or one or software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing elements and/or a plurality of types of processing elements. For example, the central processing unit may include a plurality of processors or one processor and one controller. Also, the processing unit may have a different processing configuration, such as a parallel processor.

Software may include computer programs, codes, instructions or one or more combinations thereof and may configure a processing unit to operate in a desired manner or may independently or collectively control the processing unit. Software and/or data may be permanently or temporarily embodied in any type of machine, components, physical equipment, virtual equipment, computer storage media or units or transmitted signal waves so as to be interpreted by the processing unit or to provide instructions or data to the processing unit. Software may be dispersed throughout computer systems connected via networks and may be stored or executed in a dispersion manner Software and data may be recorded in one or more computer-readable storage media.

The methods according to the above-described example embodiments of the inventive concept may be implemented with program instructions, which may be executed by computer or processor and may be recorded in computer-readable media. The media may also include, alone or in combination with the program instructions, data files, data structures, and the like. The program instructions recorded in the media may be designed and configured especially for the example embodiments of the inventive concept or be known and available to those skilled in computer software. Computer-readable media include magnetic media such as hard disks, floppy disks, and magnetic tape; optical media such as compact disc-read only memory (CD-ROM) disks and digital versatile discs (DVDs); magneto-optical media such as floptical disks; and hardware devices that are specially configured to store and perform program instructions, such as read-only memory (ROM), random access memory (RAM), flash memory, and the like. Program instructions include both machine codes, such as produced by a compiler, and higher level codes that may be executed by the computer using an interpreter. The described hardware devices may be configured to execute one or more software modules to perform the operations of the above-described example embodiments of the inventive concept, or vice versa.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

The present disclosure provides systems and methods for generating an interior design pertaining to a floor plan followed by creating a three-dimensional representation of the interior design for achieving high quality interior décor for residential as well as commercial properties.

An aspect of the present disclosure pertains to a system for generating and visualizing an interior design pertaining to a floor plan in a three-dimensional representation, the system comprising: a non-transitory storage device having embodied therein one or more routines operable to generate and represent the interior design in three-dimensional representation of the interior design pertaining to the floor plan; and one or more processors coupled to the non-transitory storage device and operable to execute the one or more routines, wherein the one or more routines include: a two-dimensional image receive module, which when executed by the one or more processors, receives a two-dimensional input image pertaining to the floor plan, wherein the floor plan comprise at least one defined space; a shape determination module, which when executed by the one or more processors, determines a bounded region of the at least one defined space by performing region expansion based on Fast Library for Approximate Nearest Neighbors (FLANN) based range search emanating from a seed point pertaining to the at least one defined space and determines shape of the at least one defined space by filling plurality of pixels of the bounded region with a reference pixel value and performing geometric extraction of the bounded region based on contour detection; an object position determination module, which when executed by the one or more processors, computes one or more parameters of the at least one defined space and determines position of one or more objects in the at least one defined space based on the one or more parameters and annotation of the at least one defined space, wherein the position of the one or more objects is determined based on a set of pre-determined design assumptions obtained using neural networks; an object placement module, which when executed by the one or more processors, places the one or more objects from a pre-built library according to the determined position of the one or more objects in the at least one defined space, wherein the placement of the one or more objects is based on developing Gaussian normal distributions based on any or a combination of dimensions of the one or more objects and dimensions of the at least one defined space; and a three-dimensional representation generation module, which when executed by the one or more processors, generates a three-dimensional representation of the interior design pertaining to the floor plan based on placement of the one or more objects in the at least one defined space.

In an embodiment, the two-dimensional image receive module receives any or a combination of the annotation and the seed point pertaining to the at least one defined space.

In an embodiment, the two-dimensional image receive module processes the two-dimensional input image to obtain a binary image, and wherein the shape determination module performs determination based on the binary image.

In an embodiment, in case the bounded region is not determined by performing determination of the bounded region based on the two-dimensional input image, the shape determination module performs said determination based on the binary image.

In an embodiment, the shape determination module fixes convexity defects of the at least one defined space by computing convex hulls.

In an embodiment, the one or more parameters include any or a combination of size of the at least one defined space, lengths of edges of the at least one defined space, location of the at least one defined shape in the floor plan, position of connectives in the at least one defined space and cardinal directions.

In an embodiment, the object position determination module fetches the set of pre-determined design assumptions from a design engine.

In an embodiment, the system further comprises an object optimization module to perform optimization of the one or more attributes of the one or more objects, wherein the one or more attributes comprise any or a combination of geometric attributes, optical attributes and structural attributes of the one or more objects.

In an embodiment, the system further comprises an interactive visualization and editor module to allow a user to modify the generated three-dimensional representation of the interior design Another aspect of the present disclosure pertains to a method comprising the steps of: receiving, by one or more processors, a two-dimensional input image pertaining to the floor plan, wherein the floor plan comprise at least one defined space; determining, by the one or more processors, a bounded region of the at least one defined space by performing region expansion based on Fast Library for Approximate Nearest Neighbors (FLANN) based range search emanating from a seed point pertaining to the at least one defined space; determining, by the one or more processors, shape of the at least one defined space by filling plurality of pixels of the bounded region with a reference pixel value and performing geometric extraction of the bounded region based on contour detection; computing, by the one or more processors, one or more parameters of the at least one defined space and determining position of one or more objects in the at least one defined space based on the one or more parameters and annotation of the at least one defined space, wherein the position of the one or more objects is determined based on a set of pre-determined design assumptions obtained using neural networks; placing, by the one or more processors, the one or more objects from a pre-built library according to the determined position of the one or more objects in the at least one defined space, wherein the placement of the one or more objects is based on developing Gaussian normal distributions based on any or a combination of dimensions of the one or more objects and dimensions of the at least one defined space; and generating, by the one or more processors, a three-dimensional representation of the interior design pertaining to the floor plan based on placement of the one or more objects in the at least one defined space.

FIG. 1 illustrates exemplary architecture of system for generating and visualizing an interior design pertaining to a floor plan in a three-dimensional representation in accordance with an embodiment of the present disclosure.

According to an embodiment of the present disclosure a system 102 can automatically generate an interior design followed by creating a three-dimensional (3D) representation of the interior design that pertains to a floor plan by using image processing, computer vision and geometry processing techniques. The system 102 can design interiors of a space or a structure of a floor plan that can pertain to a residential or a commercial property. The system 102 can also compute positions and dimensions of objects present in the space or the structure such as a room of a building. Examples of such objects include doors, windows, lighting, furniture, etc among other structural elements.

As illustrated, the system 102 can be communicatively coupled with one or more computing devices 106-1, 106-2, . . . , 106-N (individually referred to as the computing device 106 and collectively referred to as the computing devices 106, hereinafter) through a network 104. In an embodiment, the system 102 can be implemented using any or a combination of hardware components and software components such as a cloud, a server, a computing system, a computing device, a network device and the like. Further, the system 102 can interact with computing devices 106 through a website or an application that can reside in the computing devices 106. In an implementation, the system 102 can be accessed by website or application that can be configured with any operating system, including but not limited to, Android™, iOS™, and the like. Examples of the computing devices 106 can include, but are not limited to, a smart phone, a portable computer, a personal digital assistant, a handheld device, a mart device and the like.

Further, the network 104 can be a wireless network, a wired network or a combination thereof that can be implemented as one of the different types of networks, such as Intranet, Local Area Network (LAN), Wide Area Network (WAN), Internet, and the like. Further, the network 104 can either be a dedicated network or a shared network. The shared network can represent an association of the different types of networks that can use variety of protocols, for example, Hypertext Transfer Protocol (HTTP), Transmission Control Protocol/Internet Protocol (TCP/IP), Wireless Application Protocol (WAP), and the like.

In an aspect, the system 102 can receive a two-dimensional (2D) input image (also referred to at the input image, hereinafter) pertaining to a floor plan from the computing device 106. The floor plan can have various defined spaces that can pertain to room, kitchen, drawing room, and the like. An input image can be a hand drawing or a computer generated image or a photograph pertaining to the floor plan and can be converted into a machine-readable format. In an embodiment, a user can upload the 2D input image using the computing device 106 and the computing device 106 can provide the 2D image to the system 102. In an alternate embodiment, the system 102 can automatically fetch the 2D input image from a pre-defined location when a new file is added in the pre-defined location. For instance, the system 102 can be configured with a server 108, such that when an image file pertaining to the floor plan is added in the server 108, the system 102 can automatically fetch the image file. In an embodiment, if the system 102 receives a 3D representation from a computing device 106, the 3D representation can be converted into a 2D image that can be considered as the input image.

In an embodiment, the system 102 can determine shape of the space by determining a bounded region of the space. The bounded region can be determined by performing region expansion based on iterative Fast Library for Approximate Nearest Neighbors (FLANN) based range search emanating from a seed point in the 2D input image. In an embodiment the system can obtain a seed point and annotation of the space from the computing device 106. In an alternate embodiment, the system 102 can process the 2D input image to obtain a binary image so that the bounded region of the space can be determined by performing region expansion based on iterative FLANN based range search emanating from the seed point using the binary image.

Further, on determination of the bounded region, system 102 can determine shape of the space using the 2D input image or the binary image. The system 102 can fill the plurality of pixels of the bounded region with a reference pixel value for example an RGB value and extract geometry of the bounded region by performing contour detection. Additionally, the system 102 can fix convexity defects by computing convex hulls.

In an embodiment, the system 102 can compute a plurality of parameters such as size of the space, length of the edges (walls) of the space, location of the space in the floor plan, position of connectives such as doors and windows and cardinal directions implying orientation of the space. The system can use said parameters and annotation of the space to obtain position of objects to be placed in the space. The position of the object can be determined using self-learning and self-trained neural networks that can be trained using a set of pre-determined design assumptions that can be fetched form a design engine.

In an aspect, the system 102 can place the objects that can be fetched from a pre-built library containing various designs and structures according to the determined position in the space. The pre-built library can be configured with the design engine or the server 108. The system 102 can also allow the user to select objects or add new objects in the pre-built library so that the objects can be represented in the 3D representation of the interior design. The system 102 can generate a 3D representation of the interior design pertaining to the floor plan based on placement of the objects in the space.

In an embodiment, the system 102 can perform optimization of various attributes of the objects including geometric attributes, optical attributes and structural attributes. For instance, the system 102 can identify hard geometric objects having discrete variations in their geometric curvature and soft geometric objects having continuous variations in the geometric curvature based on the 3D representation. Hard objects can be processed for accurate and uniform geometry depiction by eliminating uneven corners and non-manifold edges. Soft objects can be processed using smoothing operations and normal optimization filter to even out the geometry distribution and the surface normal.

In an embodiment, the system 102 can allow the user to modify the generated 3D representation of the interior design. The system 102 can allow interactive real time rendering of the 3D representation on desktop and mobile web browsers or applications. In one embodiment, the rendering of the 3D representation with interior decor can be monitored and optimized in real-time. In addition, the system 102 can allow the user to make changes to the interior design of the space based upon certain parameters such as transformation (for e.g., translation, rotation, scale) of the object, relative location of the doors and windows, orientation of objects with respect to directions, walk space, room space usage efficiency, and the like.

Figure 2:
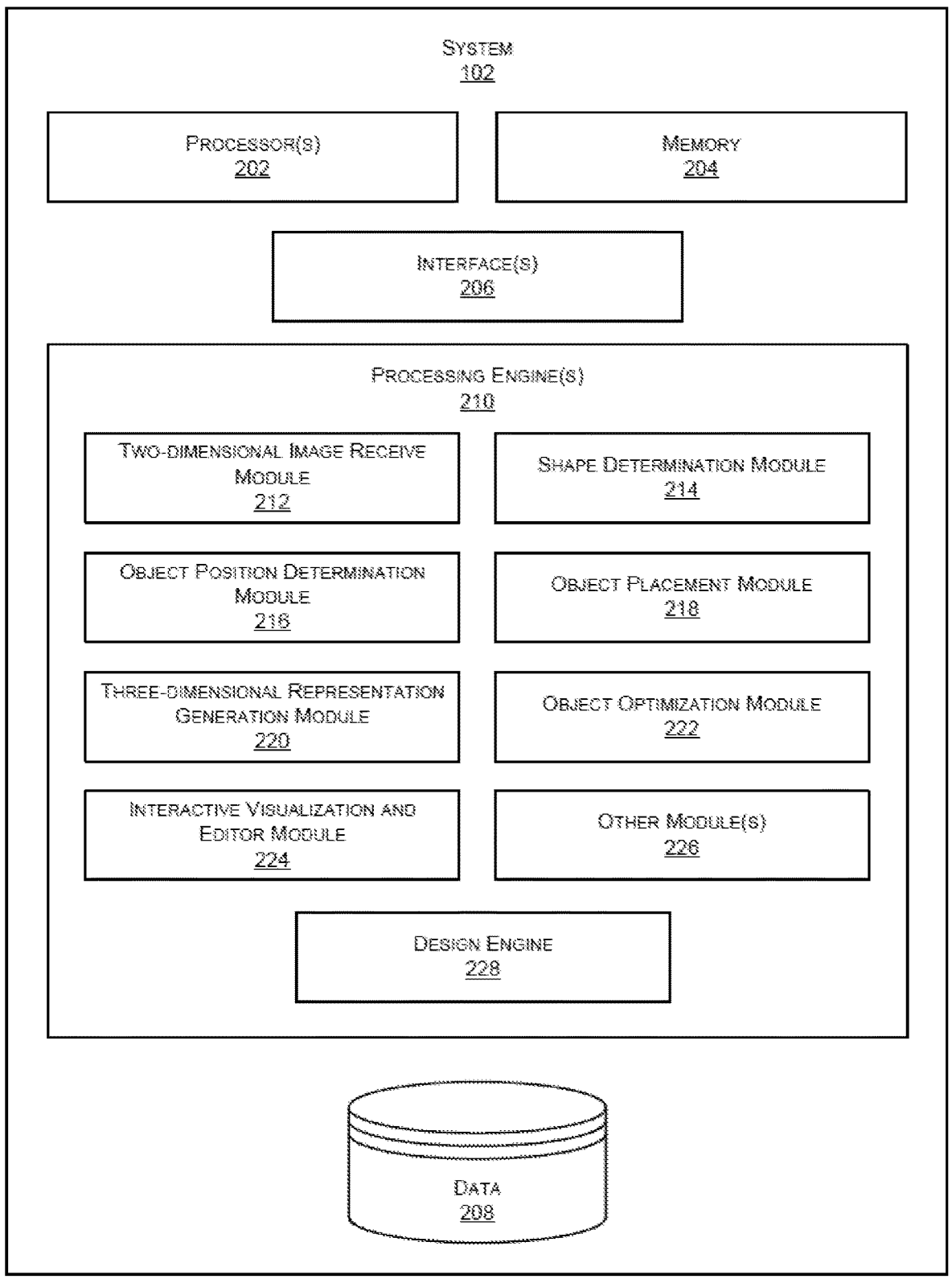
FIG. 2 illustrates exemplary functional modules of the system for generating and visualizing an interior design pertaining to a floor plan in a three-dimensional representation in accordance with an exemplary embodiment of the present disclosure.

FIG. 2 illustrates exemplary functional modules of the system for generating and visualizing an interior design pertaining to a floor plan in a three-dimensional representation in accordance with an exemplary embodiment of the present disclosure.

As illustrated, the system 102 can include one or more processor(s) 202. The one or more processor(s) 202 can be implemented as one or more microprocessors, microcomputers, microcontrollers, digital signal processors, central processing units, logic circuitries, and/or any devices that manipulate data based on operational instructions. Among other capabilities, the one or more processor(s) 202 are configured to fetch and execute computer-readable instructions stored in a memory 204 of the system 102. The memory 204 can store one or more computer-readable instructions or routines, which may be fetched and executed to create or share the data units over a network service. The memory 204 can include any non-transitory storage device including, for example, volatile memory such as RAM, or non-volatile memory such as EPROM, flash memory, and the like. In an example embodiment, the memory 204 may be a local memory or may be located remotely, such as a server, a file server, a data server, and the Cloud. In another example embodiment, memory 204 may be used to store the two-dimensional input image(s) and/or three-dimensional model image.

The system 102 can also include an interface(s) 206. The interface(s) 206 may include a variety of interfaces, for example, interfaces for data input and output devices, referred to as I/O devices, storage devices, and the like. The interface(s) 206 may facilitate communication of the system 102 with various devices coupled to the system 102. The interface(s) 206 may also provide a communication pathway for one or more components of the system 102. Examples of such components include, but are not limited to, processing engine(s) 210 and data 208.

The engine(s) can be implemented as a combination of hardware and programming (for example, programmable instructions) to implement one or more functionalities of the engine(s). In examples described herein, such combinations of hardware and programming may be implemented in several different ways. For example, the programming for the engine(s) may be processor executable instructions stored on a non-transitory machine-readable storage medium and the hardware for the engine(s) may include a processing resource (for example, one or more processors), to execute such instructions. In the present examples, the machine-readable storage medium may store instructions that, when executed by the processing resource, implement the engine(s). In such examples, the system 102 can include the machine-readable storage medium storing the instructions and the processing resource to execute the instructions, or the machine-readable storage medium may be separate but accessible to system 102 and the processing resource. In other examples, the engine(s) may be implemented by electronic circuitry. The data 208 can include data that is either stored or generated as a result of functionalities implemented by any of the components of the engine(s).

In an example, the processing engine(s) 210 can include a two-dimensional image receive module 212, a shape determination module 214, an object position determination module 216, an object placement module 218, a three-dimensional representation generation module 220, an object optimization module 222, an interactive visualization and editor module 224, other module(s) 226 and a design engine 228. The other module(s) 226 can implement functionalities that supplement applications or functions performed by the system 102 or the processing engine(s) 210.

In an aspect, the two-dimensional image receive module 212 can receive a 2D input image that can pertain to a floor plan. In an embodiment the image receive module 212 can receive the input image through the interface(s) 206 configured with the system 102, where the interface(s) 206 can include one or more input device(s) such as a keyboard, a mouse, a display, a touch-screen display, and the like. Also, the input image can be received through one or more input port(s) of the interface(s) 206 such as Universal Serial Bus (USB) port, serial port and the like.

In an embodiment, the two-dimensional image receive module 212 can receive the input image from any computing device that can be communicatively coupled with the system 102. The input image can be a 2D representation of a floor plan and can include at least one defined space (interchangeably referred to as space, hereinafter) that can pertain to room, kitchen, drawing room, and the like. Further, the input image can be any image such as a hand-drawn image, a sketch, a photograph, a computer generated image and so forth. The computer generated image can be any image developed using software such as Adobe Photoshop™, CorelDRAW™, etc. Hence, the input image can be in any image file format such as JPEG, TIFF, PSD, PNG, or any other equivalent format or in any document file format such as a PDF, DWG, DXF, CAD file, or any other equivalent format. Further, it would be appreciated that if the floor plan is not in a suitable format, the two-dimensional image receive module 212 can convert the input image into the suitable format to perform further processing. In an embodiment, if the two-dimensional image receives module 212 receives a 3D representation; the 3D representation can be converted into a 2D image that can be considered as the input image.

In an embodiment, the two-dimensional image receive module 212 can receive the input image from a user manually. For example, the user can upload a hand-drawn sketch of a floor plan or can upload the computer generated image of the floor plan. In another embodiment, the two-dimensional image receive module 212 can fetch the input image from a pre-defined location. For example, two-dimensional image receive module 212 can fetch the 2D image once a new file/image is added for a pre-defined location such that the system 102. Also, two-dimensional image receive module 212 can check the pre-defined location at regular intervals for addition of new files.

In an embodiment, the two-dimensional image receive module 212 can receive annotation and seed point pertaining to the defined space. For example, annotation can indicate type of space say a living room, a kitchen, a bed room and the like. In an example, the seed point can be any point in the defined space of the 2D input image of the floor plan say, a point selected or clicked by the user in the 2D input image.

In an aspect, the shape determination module 214 can determine shape of the space. Firstly, pixel values of the 2D input image can be obtained. In an embodiment, to represent color images, separate red, green and blue components can be specified for each pixel (assuming an RGB color space), and so the pixel value can be a vector of three numbers representing red, green and blue components. In an alternate embodiment, the shape determination module 214 can convert the 2D input image into a grayscale image where the each pixel value can be a single number that can represent brightness of the pixel. A common pixel format for gray scale image is a byte image, where a number is stored as an 8-bit integer giving a range of possible values from 0 to 255. Typically zero is taken to be black, and 255 is taken to be white and values in between make up different shades of gray.

For determination of the shape of the space, the shape determination module 214 can determine a bounded region of the space by performing region expansion based on iterative Fast Library for Approximate Nearest Neighbors (FLANN) based range search emanating from the seed point in the 2D input image. As it would be appreciated by the one skilled in the art, FLANN contains a collection of algorithms for nearest neighbor search and a technique for automatically choosing the best algorithm and optimum parameters depending on the dataset. According to the present disclosure, a FLANN based nearest neighbor search can be used to determine bounded region of the space.

In an alternate embodiment, the shape determination module 214 can process the 2D input image to obtain a binary image. The shape determination module 214 can perform thresholding of the gray-scale image based on a pre-determined threshold value to generate the binary image. It should be noted that a variety of thresholding operations may be implemented by the shape determination module 214 to convert the gray scale image to the binary image. Example techniques include, but are not limited to, adaptive Gaussian thresholding, OTSU thresholding, and global thresholding. Further, the shape determination module 214 can determine the bounded region of the space by performing region expansion based on iterative FLANN based range search emanating from the seed point using the binary image.

In an embodiment, Iterative FLANN based range search emanating from the seed point is based on calculation of absolute and relative gradient for the pixel values with respect to the seed point pixel values and immediately previous pixel values respectively and comparing the absolute and relative gradient with absolute gradient threshold and relative gradient threshold respectively.

In an embodiment, if the shape determination module 214 is unable to determine the bounded region using the 2D input image, the shape determination module 214 can proceed to determine the bounded region using the binary image. In the binary image, the shape determination module 214 can consider location of connectives such as doors and windows that can either be computed by the shape determination module 214 or received by the system 102. It would be appreciated that this technique enhances the reliability of the system 102.

Further, on determination of the bounded region, the shape determination module 214 can determine shape of the space using the 2D input image or the binary image. The shape determination module 214 can fill the plurality of pixels of the bounded region with a reference pixel value for example an RGB value and extract geometry of the bounded region by performing contour detection. As would be appreciated by the one skilled in the art, contours are boundary lines of geometric shapes within a digital image. Once contours have been extracted, several shape features such as perimeter length, irregularity, width, height, aspect ratio, and area of the space can be determined. Additionally, shape determination module 214 can fix convexity defects such as cavity in the contour by computing convex hulls. A detailed description of the working of the shape determination module 214 is provided below with reference to FIG. 4.

In an embodiment, the object position determination module 216 can determine a plurality of parameters associated with the space. Such parameters include size of the space, length of the edges (walls) of the space, location of the space in the floor plan, position of connectives such as doors and windows and cardinal directions implying orientation of the space. In one embodiment, the object position determination module 216 can use said parameters and annotation of the space to obtain position of objects to be placed in the space. The position of the object can be determined using neural networks. It should be noted that the neural networks of the present disclosure are self-learning and self-trained rather than being explicitly programmed. In an example embodiment, a neural network can have a training phase and a testing phase, where the training phase can be associated with learning from input training data and the corresponding output training data. Further during the testing phase the neural network can utilize the input test data to generate output test data. In an example, the output obtained from the neural network can comprise position of objects to be placed in the space based upon the trained neural network which is trained using a set of pre-determined design assumptions that can be fetched form the design engine 228. A detailed description of the working of the object position determination module 216 is provided below with reference to FIG. 5.

In an embodiment, a variety of design assumptions can be fetched from the design engine 228 to train the neural network. The design assumptions can be explained with the aid of various examples, for example, for a space annotated as bedroom, objects such as a bed and a painting can be positioned on the longest wall without a door. Further, a wardrobe can be positioned on the second longest wall without the door. The design assumptions can provide positioning of the objects such that there are no collisions of people moving in the space. In another example, for a space annotated as kitchen, the cabinets can be positioned on the longest wall of the space. Again, such design may be based upon the assumption that collisions with the overhead cabinets and chimney are avoided. Similarly, the placement of the sink can be determined based upon position of the second longest wall in the kitchen. In another example, for a space annotated as a living room, the longest wall not containing any connectives can have a television cabinet and a couch can be positioned in the vicinity of the television cabinet by avoiding collisions with walls, objects or connectives. It should be noted that for each annotation of space, a certain set of pre-defined design assumptions can be considered to determine the position of the objects within the space. Such design assumptions may be revised by the user and can be updated in the design engine 228.

In an aspect, the object placement module 218 can place the objects according to the determined position in the space. The objects can be fetched from a pre-built library containing various designs and structures of objects. In an embodiment, the pre-built library can be configured with the design engine 228. In an embodiment, the object placement module 218 can allow the user to select the objects and object position determination module 216 can then determine position of the objects and based upon said determination the object placement module 218 can place the objects in the defined space. In an embodiment, the object placement module 218 can automatically place preferred objects in the space, where preferred objects can be selected based on annotation of the space. Further, the object placement module 218 can allow the user to place additional objects in the space by including the additional objects in the pre-built library.

In an embodiment, the object placement module 218 can develop Gaussian normal determinations based on dimensions of space or dimensions of the objects. In an instance, for objects such as doors and windows, Gaussian normal distribution can be developed with length and breadth of doors and windows as parameters to determine a probability region value. Here, Gaussian normal distribution is optimized with length and the breadth of the space as parameters. Corresponding objects for the space are used based on the probability region value. For example, if the floor plan room length falls in the maximum probability region, a normal object is used and if the floor plan room length falls in other probability regions, corresponding objects are used. In another instance, Gaussian normal distributions can be developed with the length and breadth of the space as parameters. A detailed description of the working of the object placement module 218 is provided below with reference to FIG. 6.

In an aspect, the three-dimensional representation generation module 220 can generate a 3D representation of the interior design pertaining to the floor plan based on placement of the objects in the space. It would be appreciated that, creation of 3D representation of the interior design allows a user to visualize placement of various objects such as doors, windows, lighting, furniture, fixtures, etc in various spaces of a floor plan.

In an embodiment, generated 3D representation with objects placed in the space can be received by the object optimization module 222. The object optimization module 222 can perform optimization of various attributes of the objects. The various objects include, but are not limited to, geometric attributes, optical attributes and structural attributes of the objects. In an embodiment, the object optimization module 222 can optimize geometric attributes of the objects. The object optimization module 222 can identify hard geometric objects and soft geometric objects based on the 3D representation. As used herein, the hard geometric objects can be objects that have discrete variations in their geometric curvature. For example, the hard geometric objects may include wall objects. Such objects can be processed for accurate and uniform geometry depiction by eliminating uneven corners and non-manifold edges. The soft geometric objects can be objects that have continuous variations in the geometric curvature. For example, the soft geometric objects can include furniture objects. Such objects are processed using smoothing operations and normal optimization filter to even out the geometry distribution and the surface normal.

In an embodiment, the object optimization module 222 can optimize optical attributes of the objects. For example, the object optimization module 222 can optimize light reflection properties on the surface of the soft geometric objects. Further, a 3D representation of the space with interior décor can be obtained by combining the processed hard and soft geometric objects. In addition, a generic lighting system may be incorporated to simulate day light simulation conditions. Further, a shadow generator can be incorporated to light sources and to the objects of the space to achieve a blur variance shadow simulation. In an embodiment, the object optimization module 222 can optimize structural attributes of the objects. For example, the object optimization module 222 can perform material and texture enhancement operations on the 3D representation.

In an embodiment, the interactive visualization and editor module 224 can allow the user to modify the generated 3D representation of the interior design. The interactive visualization and editor module 224 can allow interactive real time rendering of the 3D representation on desktop and mobile web browsers or applications. In one embodiment, the rendering of the 3D representation with interior decor can be monitored and optimized in real-time. In one example, the desktop hardware performance can be monitored in real-time from the web browser interface to optimize the shadows, texture and geometry in a specific order. The shadows can be shifted from Blur Variance to Variance or Poisson for optimizing the performance In addition, the textures can be optimized by reducing size of the texture in the ratio of 2:1. In one embodiment, the interactive visualization and editor module 224 can perform the geometry optimization by applying decimation filters on the 3D representation.

In one embodiment, the interactive visualization and editor module 224 can provide interactive rendering in an isometric interactive view (third person) and a first person view in the desktop version. In the third person view, users may be provided with multiple options to change the position and orientation of the interior décor objects using a pre-built library of such objects/structures.

In another example, the hardware performance of the computing device such as smart phone can be monitored continuously using the web browser platform to control the visibility and the optimization of the 3D representation. In such an embodiment, the visibility of the interiors can be decided based on the current frames per second (fps) rendering performance of the 3D representation on a web browser/application. If the fps rendering of the scene falls below a pre-set threshold, the interior objects such as the soft geometric objects can be hidden as they may consume a lot of resources during the interactive rendering. It should be noted that the optimization of the shadows, texture and geometry can be implemented in a similar way as for the desktop version. In embodiment, interactive rendering may be offered in the third person view and a Virtual reality view (VR) to support head mounted display (HMD) devices.

In addition, the interactive visualization and editor module 224 can allow a user to make changes to the interior design of the space based upon certain parameters such as transformation (for e.g., translation, rotation, scale) of the object, relative location of the doors and windows, orientation of objects with respect to directions, walk space, room space usage efficiency, and the like.

It should be noted embodiments of the present disclosure are explained by considering a 2D image as an input. However, if the input is a 3D representation, the two-dimensional image receive module 212 can convert the 3D representation into a 2D image for creation of 3D representation of the interior design.

In an embodiment herein, all of the modules depicted in FIG. 2 can be present in a single computing device, such as a computer, a laptop, a mobile device, a tablet and the like. In another embodiment, the one or more of the modules are present across various devices communicatively coupled with each other.

Figure 3:
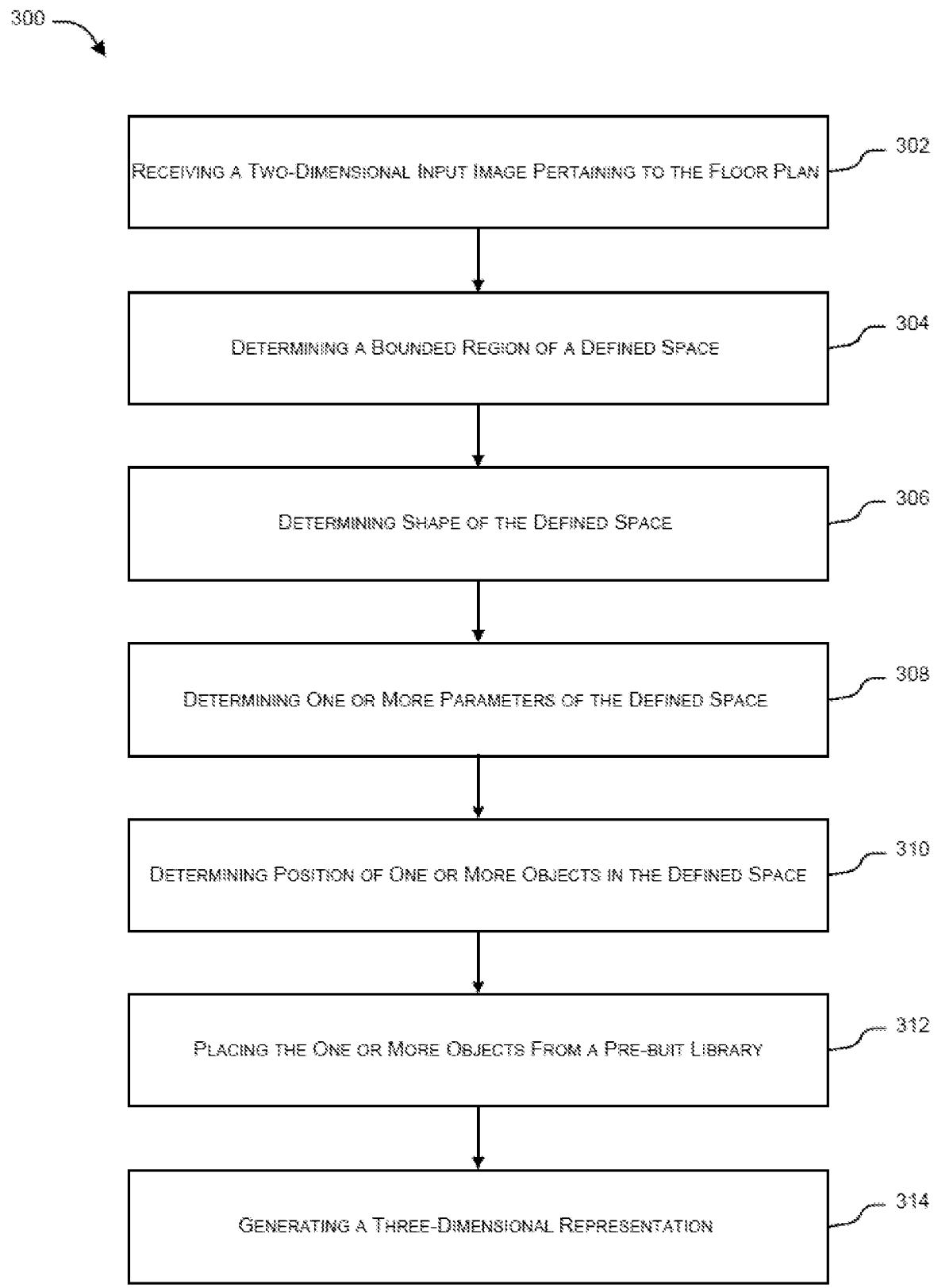
FIG. 3 is a flow chart illustrating a process generating and visualizing an interior design pertaining to a floor plan in a three-dimensional representation in accordance with an embodiment of the present disclosure.

FIG. 3 is a flow chart illustrating a process for generating and visualizing an interior design pertaining to a floor plan in a three-dimensional representation in accordance with an embodiment of the present disclosure.

In an aspect, a method to generate a 3D representation of an interior design pertaining to a floor plan can include a step 302 that pertains to receiving a 2D input image pertaining to the floor plan from a computing device. The floor plan can include various defined spaces. The input image can be provided manually by a user or can be fetched from a pre-defined location. The input image can be a 2D representation of a floor plan, and can be in the form an image format such as JPEG, TIFF, PSD, and PNG) or a document format such as a PDF, CAD file, or any other equivalent format.

In an aspect, the method can include a step 304 that pertains to determining of a bounded region of a defined space. A seed point and the pixel values (RGB) corresponding to the image can be obtained. Further, an iterative Fast Library for Approximate Nearest Neighbors range search can be performed emanating from the seed point for determining the bounded region.

In an aspect, the method can include a step 306 that pertains to determining shape of the defined space. The shape of the defined space can be obtained by filling the pixels of the bounded region with reference pixel value say RGB values and extracting geometry of the bounded region performing by contour detection.

In an aspect, the method can include a step of 308 that pertains to determining of one or parameters of the defined space. In an embodiment, various parameters can be computed based on shape of the space. The parameters can include but are not limited to size of the space, length of the walls of the space, location of the space, position of connectives such as doors and windows positioned in the space and the cardinal directions implying orientation of the space.

In an aspect, the method can include a step 310 that pertains to determining position of objects in the defined space. The position of various objects can be based upon pre-determined design assumptions that can be obtained using neural network. Said assumptions can be extracted from a design engine. In order to provide clarity, design assumptions can be explained with the help of various examples. For example, for a space annotated as living room, a TV cabinet can be positioned on the longest wall with no door and a couch can be positioned in front of the TV cabinet. The positioning of the objects can be assumed while keeping in view that no collisions occur.

In an aspect, the method can include a step 312 that pertains to placing the object from a pre-built library. In an embodiment, the pre-built library can contain structures of various objects and can be configured with a design engine. Further, the objects can be placed based upon the selection made by the user from a pre-built object library. Additionally, new objects can be added by the user to the pre-built library of objects. For various objects, Gaussian normal distribution can be performed to determine probability region value. Moreover, corresponding objects can be used based on the probability region value. For example, if the floor plan room length falls in the maximum probability region, a normal object can be used and if the floor plan room length falls in other probability regions, corresponding objects can be used.

In an aspect, the method can include a step 314 that pertains to generating a 3D representation based on placement of the objects in the defined space. It would be appreciated that, creation of 3D representation of the interior design allows a user to visualize placement of various objects such as doors, windows, lighting, furniture, fixtures, etc in various spaces of a floor plan.

In an embodiment, real-time optimization of geometry, textures and shadows can be performed. Further, hard geometric objects and soft geometric objects of the space can be identified. The hard-geometric objects such as wall objects can be processed for accurate and uniform geometry depiction by eliminating the uneven corners and non-manifold edges. The soft geometric objects that have continuous variations in the geometric curvature such as furniture objects can be processed using smoothing operations and normal optimization filter to even out the geometry distribution and the surface normal.

In an embodiment, the light reflection properties can be optimized on the surface of the soft geometric objects. Also, material and texture enhancement operations can be performed on the 3D model. In addition, a generic lighting system can be utilized to simulate the day light simulation conditions. Furthermore, a shadow generator can be added to the light sources and to the objects to achieve a better blur variance shadow simulation.

In an embodiment, an interactive real time rendering of the 3D representation can be achieved on desktop and mobile web browsers. The rendering of the 3D representation with interior decor can be monitored and optimized in real time. For example, the desktop hardware performance can be monitored in real time from the web browser/application interface to optimize the shadows, texture and geometry in a specific order. In an embodiment, the user may edit the position or orientation of the objects and the respective changes can be stored in the memory along with the space parameters. Further, such data can be used as input training data to retrain the neural network.

Figure 4:
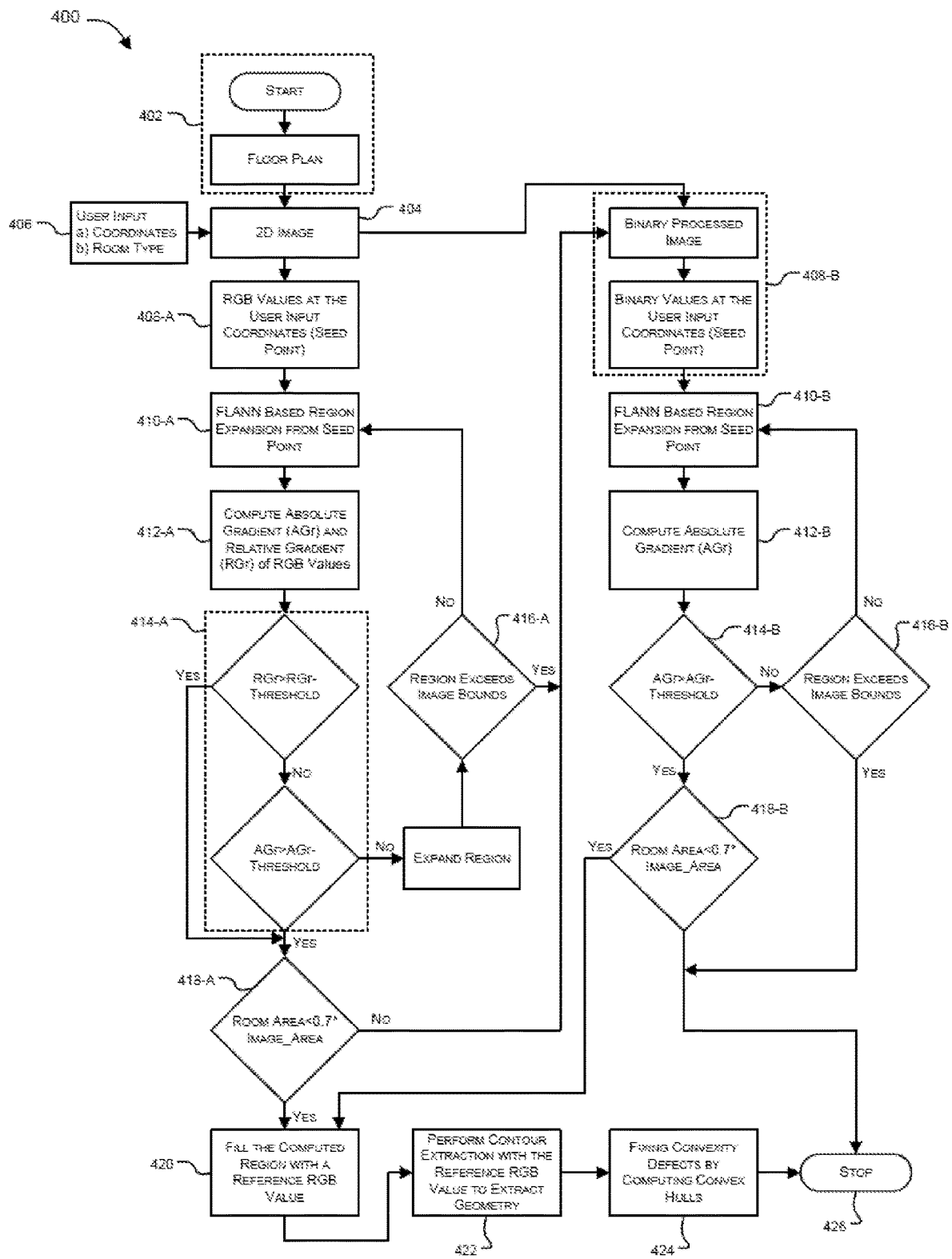
FIG. 4 is a flow chart illustrating working of the space determination module in accordance with an embodiment of the present disclosure.

FIG. 4 is a flow chart illustrating working of the space determination module in accordance with an embodiment of the present disclosure.

At block 402, an image of a floor plan can be received as an input from a user manually or can be fetched from a pre-defined location. At block 404, in case the floor plan is a 3D representation, it can be converted into a 2D input image.

At block 406, space annotation and coordinates of seed point can be received from the user. In an example, pixel values (RGB) can be obtained (block 408-A) of the seed point. In another example, the 2D input image is converted to a binary image (block 408-B), and binary values at the seed point can be obtained.

An iterative Fast Library for Approximate Nearest Neighbors (FLANN) based range search can be performed from the corresponding seed point for detection of a bounded region based on an absolute gradient threshold and relative gradient threshold for pixel values of the input image (blocks 410-A and 410-B).

At block 412-A, the estimated threshold values are used to determine a range expansion region to obtain a bounded region. An absolute gradient (AGr) and a relative gradient (RGr) for the pixel values (RGB) can be estimated. Similarly, at block 412-B, an absolute gradient (AGr) for the binary values can be estimated. It may be noted that absolute gradient may be computed with respect to the seed point pixel values and relative gradient may be computed with respect to immediate previous pixel values.

At block 414-A, the relative gradient can be compared with relative gradient threshold and/or the absolute gradient can be compared with the absolute gradient threshold. In an embodiment, if relative gradient is greater than relative gradient threshold and/or absolute gradient is greater than absolute gradient threshold, then the range expansion in that region can be stopped. Alternatively, if both the conditions turn out to be false, the region continues to expand and repeats the FLANN step (block 410-A). In addition, the condition that the region is still within the bounds of the image is verified Similar process is performed at block 414-B where absolute gradient is compared with absolute gradient threshold.

At blocks 418-A, if range search leads to an unbounded region say if the bounded region has less than 3 sides or space has an area greater than a threshold (For example, 0.7 of total area of image), then an iterative FLANN based range search can be performed on binary image (block 408-B) with location of doors and windows either computed or supplied previously by the user. Alternatively, it can be verified whether the size of the bounded region is within the accepted limit.

At block 420, using an original image or binary image, the computed bounded region is filled with reference RGB values.

At block 422, a contour extraction is performed with reference RGB value for geometry extraction. In addition, at block 424, convexity defects, if any, can be fixed by computing convex hulls and shape of the selected space can determined along with user annotations.

Figure 5:
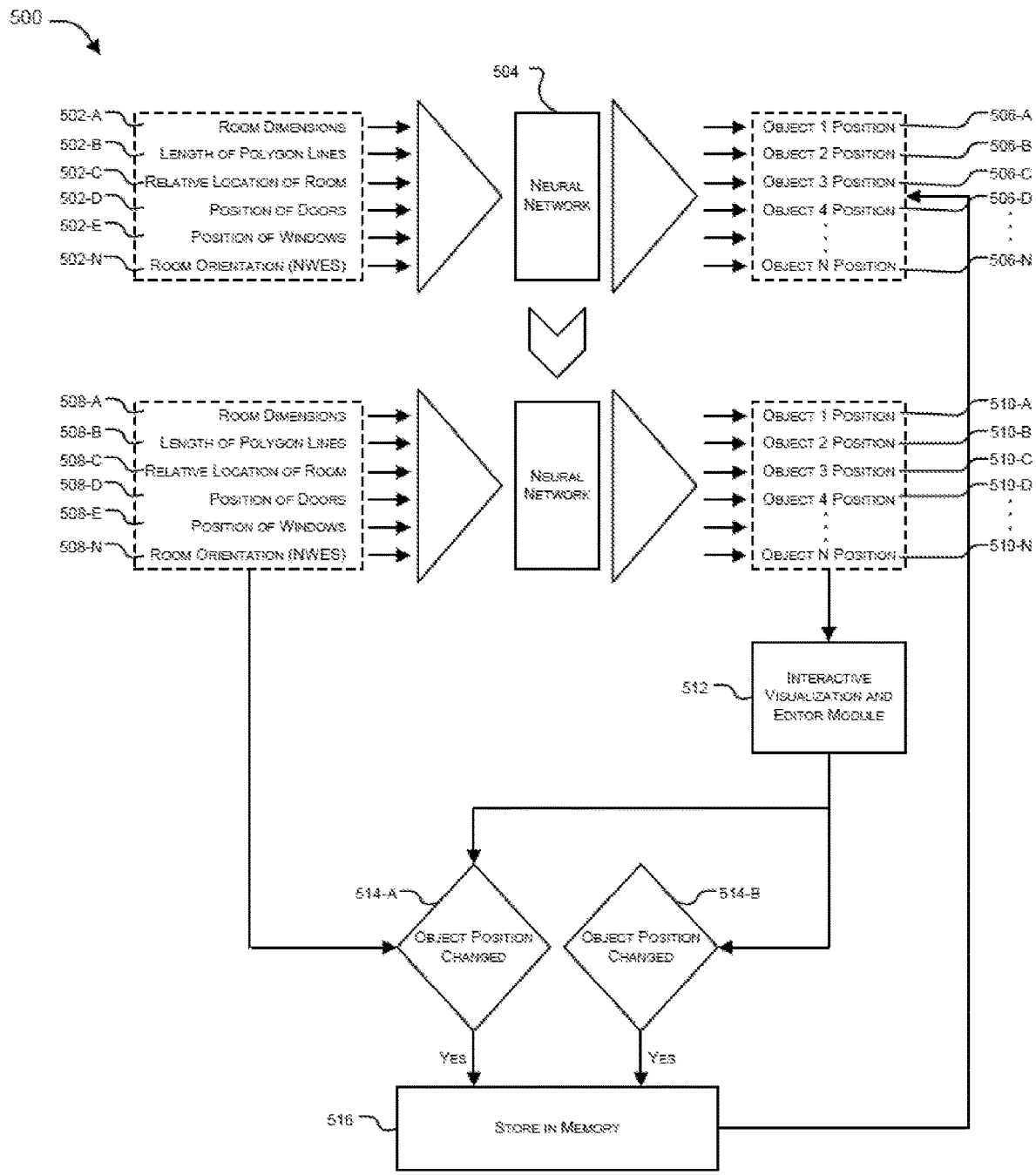
FIG. 5 is an exemplary representation of working of the object position determination module in accordance with an embodiment of the present disclosure.

FIG. 5 is an exemplary representation of working of the object position determination module in accordance with an embodiment of the present disclosure.

In an embodiment, designing of the space is based on the annotation (bedroom, living room etc) and shape of the space using a neural network for each annotation type using pre-determined design assumptions. The design assumptions can be provided by the user and can be updated from time-to-time. A plurality of parameters associated with the space to be designed can be computed based on the determined shape. Such parameters can include, but are not limited to, size of the space, length of the walls of the space, location of the space, position of connectives such as doors and windows positioned in the space and cardinal direction implying orientation of the space, as referred by reference numerals 502-A through 502-N. In an example embodiment, a neural network 504 can have a training phase and a testing phase, wherein the training phase is associated with learning from input training data and the corresponding training outputs. In one embodiment, the process 500 of the system 102 uses such parameters as input data to obtain the position of objects placed in the space based on pre-determined design assumptions using neural networks.

In an embodiment, the pre-determined design assumptions can be extracted from the design engine and can be used only once when the system is setup to train the neural network. For example, for a space annotated as living room, a TV cabinet will be positioned on the longest wall with no door and a couch will be positioned in front of the TV cabinet. In another example, for a space annotated as bedroom, a bed and a painting will be positioned at the longest wall with no door or a window. Wardrobe will be positioned on the second longest wall with no door or a window. The positioning of the objects can be assumed while keeping in view that no collisions occur.

In another embodiment, based on the input parameters for the space during the training phase, neural network 504 can give the output which are the positions of the objects (such as bed, wardrobe, couch and the like) as referred by reference numerals 506-A through 506-N, corresponding to the type of annotation.

In one embodiment, positions can be given to the interactive visualization and editor module 512 of the system 102. If the user edits the position or orientation of the objects (e.g., bed, wardrobe placed in the space) then the changes can be stored in the memory 616 along with the space parameters (inputs for neural network) which can be further used to retrain the neural network. The retraining happens only if the number of changes captured by the interactive visualization and editor module exceeds a certain number "N".

Further, during the testing phase the neural network 504 can utilize the input as referred by reference numerals 508-A through 508-N and generate output as referred by reference numerals 510-A through 510-N. In an example, the output obtained from the neural network 504 can comprise position of objects placed in the space based upon pre-determined design assumptions.

Figure 6:
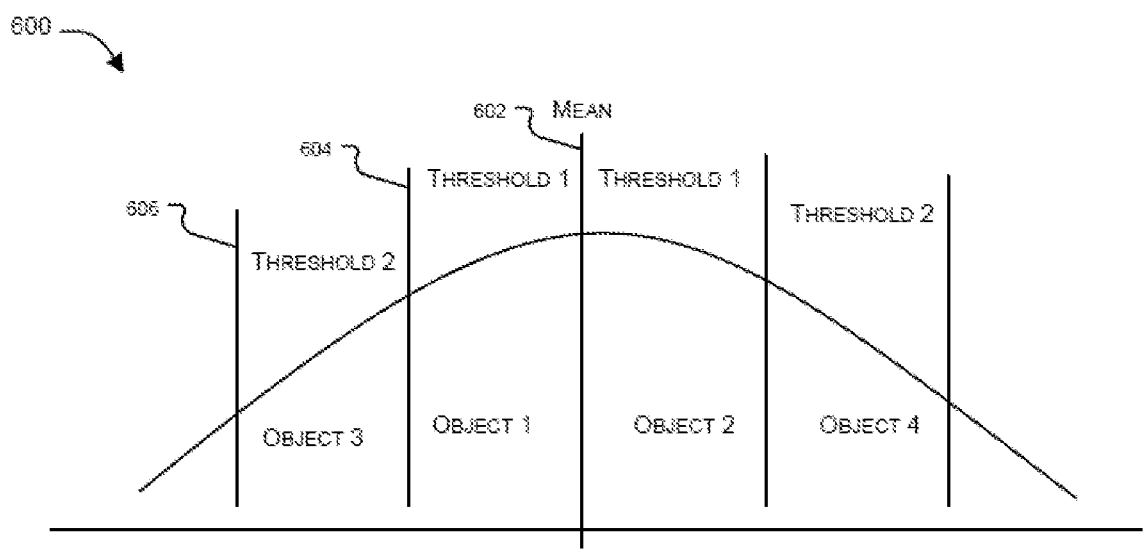
FIG. 6 is an example graph illustrating Gaussian normal distribution used to determine the probability region in a space according to an exemplary embodiment of the present disclosure.

FIG. 6 is an example graph illustrating Gaussian normal distribution used to determine the probability region in a space according to an exemplary embodiment of the present disclosure.

In one embodiment, the Gaussian normal distribution 600 can be optimized with every floor plan with length and breadth of the objects such as doors and windows as input parameters to the distribution. A probability density function (PDF) can be formed with a mean value (µ) 602 and a standard deviation value (v). The probability distribution function (PDF) of a Gaussian normal distribution can be represented by the following equation:

$$PDF: F(x|\mu, \sigma^2) = \frac{1}{\sqrt{2\sigma^2\pi}} e^{-\frac{(x-\mu)^2}{2\sigma^2}} \quad \text{(Equation 1)}$$

Where, PDF is the probability distribution function for a variable x

µ is the mean value; and v is the standard deviation value

The mean value and the standard deviation value can be computed using examples of several floor plans. In one example, about 5 floor plans can be used to compute the mean and the standard deviation values. The probability deviation values can be optimized and the mean and standard deviation values can be recomputed with every floor plan being added to the system 102. The PDF constitutes a learning module for the decision-making to decide which type of door or window to be used at specific location. In the illustrated embodiment, threshold values for different objects are generally represented by reference numerals 604 and 606.

In an example, two Gaussian normal distributions can be formed, one for length parameter and another for breadth in the case of door and window. With a probability of length and depth computed from the PDF and based on the position of the probability on the PDF, the type of the doors or windows corresponding to that sector can be shortlisted and eventually decision can be taken based on both length and breadth parameters. Similarly, the technique may be adapted for furniture objects with length and breadth parameters being considered for the formation of the PDF.

FIG. 7A-D illustrate exemplary representations of for generating and visualizing an interior design pertaining to a floor plan in a three-dimensional representation in accordance with an embodiment of the present disclosure.

Figure 7A:
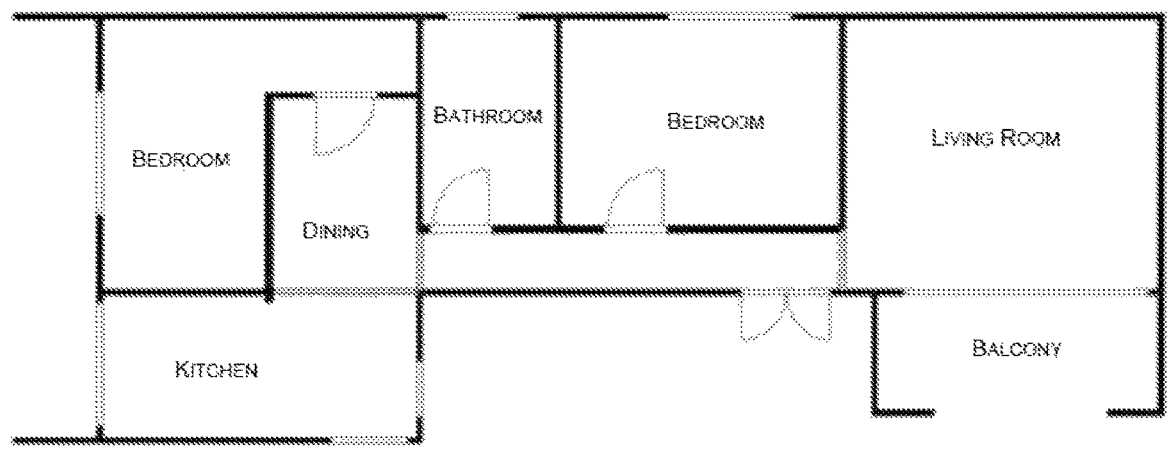
FIG. 7A-D illustrate exemplary representations of generation of a three-dimensional representation of interior design in accordance with an embodiment of the present disclosure.
Figure 7B:
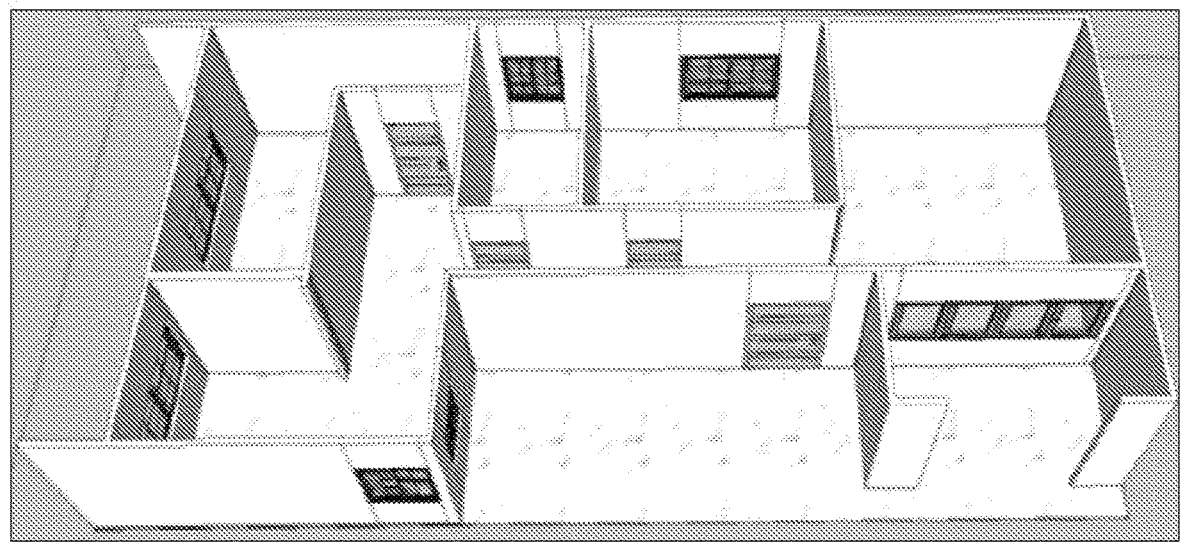
Figure 7C:
Figure 7D:
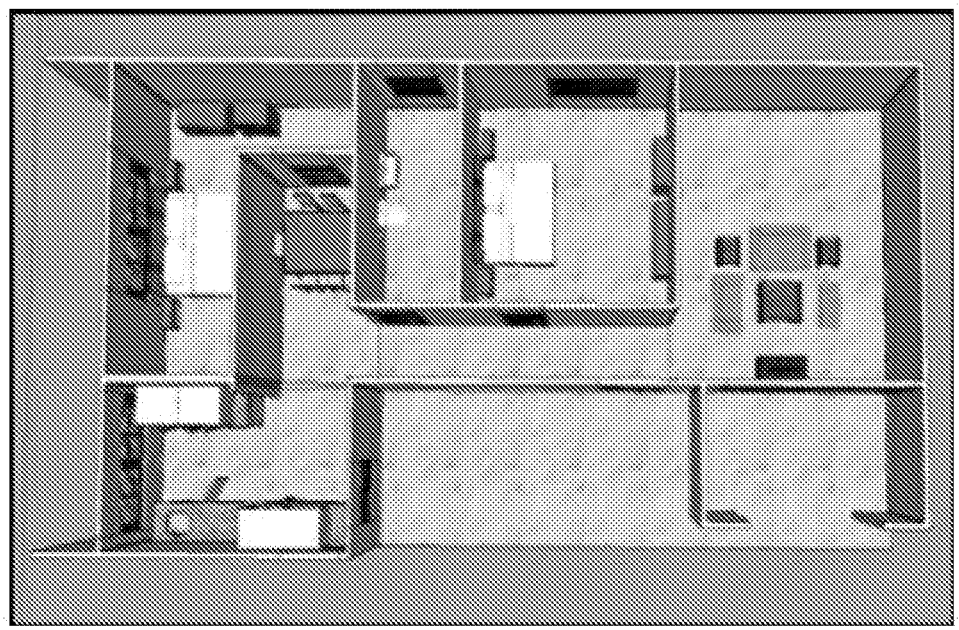

FIG. 7A illustrates a 2D floor plan image having various spaces. The 2D floor plan image can be extruded to generate the detailed 3D representation as illustrated in FIG. 7B. The detailed 3D model as illustrated in FIG. 7B can be further designed and enhanced with a high-quality 3D interior decor. In one embodiment, an iterative FLANN range search is performed to determine the range expansion region to obtain a bounded region. The bounded region can be filled with a reference RGB value and geometry of the bounded region can be extracted. The positioning of the objects such as wardrobes and furniture can be determined using neural networks while keeping in view that no collisions occur. In some examples, shadows, textures and geometry can be optimized and the generated 3D representation with interior décor is rendered for high quality visualization. In some examples, different views as illustrated in FIG. 7C and FIG. 7D of can be rendered on a display.

Figure 8:
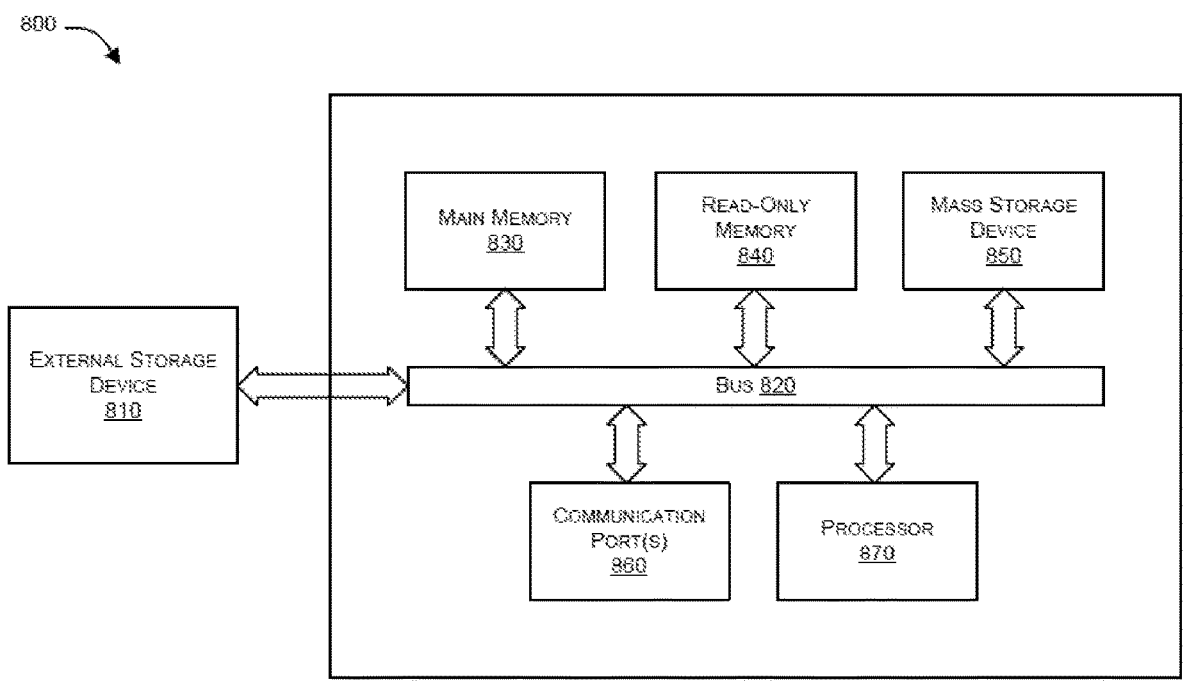
FIG. 8 illustrates an exemplary computer system in which or with which embodiments of the present disclosure can be utilized in accordance with embodiments of the present disclosure.

FIG. 8 illustrates an exemplary computer system in which or with which embodiments of the present disclosure can be utilized in accordance with embodiments of the present disclosure.

As shown in FIG. 8, computer system includes an external storage device 810, a bus 820, a main memory 830, a read only memory 840, a mass storage device 850, communication port 860, and a processor 870. A person skilled in the art will appreciate that computer system may include more than one processor and communication ports. Examples of processor 870 include, but are not limited to, an Intel® Itanium® or Itanium 2 processor(s), or AMD® Opteron® or Athlon MP® processor(s), Motorola® lines of processors, FortiSOC™ system on a chip processors or other future processors. Processor 870 may include various modules associated with embodiments of the present invention. Communication port 860 can be any of an RS-232 port for use with a modem based dialup connection, a 10/100 Ethernet port, a Gigabit or 10 Gigabit port using copper or fiber, a serial port, a parallel port, or other existing or future ports. Communication port 860 may be chosen depending on a network, such a Local Area Network (LAN), Wide Area Network (WAN), or any network to which computer system connects.

Memory 830 can be Random Access Memory (RAM), or any other dynamic storage device commonly known in the art. Read only memory 840 can be any static storage device(s) e.g., but not limited to, a Programmable Read Only Memory (PROM) chips for storing static information e.g., start-up or BIOS instructions for processor 870. Mass storage 850 may be any current or future mass storage solution, which can be used to store information and/or instructions. Exemplary mass storage solutions include, but are not limited to, Parallel Advanced Technology Attachment (PATA) or Serial Advanced Technology Attachment (SATA) hard disk drives or solid-state drives (internal or external, e.g., having Universal Serial Bus (USB) and/or Firewire interfaces), e.g. those available from Seagate (e.g., the Seagate Barracuda 7102 family) or Hitachi (e.g., the Hitachi Deskstar 7K1000), one or more optical discs, Redundant Array of Independent Disks (RAID) storage, e.g. an array of disks (e.g., SATA arrays), available from various vendors including Dot Hill Systems Corp., LaCie, Nexsan Technologies, Inc. and Enhance Technology, Inc.

Bus 820 communicatively couples processor(s) 870 with the other memory, storage and communication blocks. Bus 820 can be, e.g. a Peripheral Component Interconnect (PCI)/ PCI Extended (PCI-X) bus, Small Computer System Interface (SCSI), USB or the like, for connecting expansion cards, drives and other subsystems as well as other buses, such a front side bus (FSB), which connects processor 870 to software system.

Optionally, operator and administrative interfaces, e.g. a display, keyboard, and a cursor control device, may also be coupled to bus 820 to support direct operator interaction with computer system. Other operator and administrative interfaces can be provided through network connections connected through communication port 860. External storage device 810 can be any kind of external hard-drives, floppy drives, IOMEGA® Zip Drives, Compact Disc—Read Only Memory (CD-ROM), Compact Disc—Re-Writable (CD-RW), Digital Video Disk—Read Only Memory (DVD-ROM). Components described above are meant only to exemplify various possibilities. In no way should the aforementioned exemplary computer system limit the scope of the present disclosure.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

While only certain features of several embodiments have been illustrated and described herein, many modifications and changes will occur to those skilled in the art. It is, therefore, to be understood that the appended claims are intended to cover all such modifications and changes as fall within the true spirit of inventive concepts.

The afore-mentioned description is merely illustrative in nature and is in no way intended to limit the disclosure, its application, or uses. The broad teachings of the disclosure may be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the example embodiments is described above as having certain features, any one or more of those features described with respect to any example embodiment of the disclosure may be implemented in and/or combined with features of any of the other embodiments, even if that combination is not explicitly described. In other words, the described example embodiments are not mutually exclusive, and permutations of one or more example embodiments with one another remain within the scope of this disclosure.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a limiting/restrictive of inventive concepts. Rather, numerous variations and modifications are possible in the context of the present disclosure, in particular those variants and combinations which may be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods. Further, elements and/or features of different example embodiments may be combined with each other and/or substituted for each other within the scope of this disclosure and appended claims.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions, which have a configuration that is independent of the subject matters of the preceding dependent claims.

Still further, any one of the above-described and other example features of example embodiments may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Further, at least one example embodiment relates to a non-transitory computer-readable storage medium comprising electronically readable control information (e.g., computer-readable instructions) stored thereon, configured such that when the storage medium is used in a controller of a magnetic resonance device, at least one example embodiment of the method is carried out.

Even further, any of the afore-mentioned methods may be embodied in the form of a program. The program may be stored on a non-transitory computer readable medium, such that when run on a computer device (e.g., a processor), cause the computer-device to perform any one of the afore-mentioned methods. Thus, the non-transitory, tangible computer readable medium is adapted to store information and is adapted to interact with a data processing facility or computer device to execute the program of any of the above-mentioned embodiments and/or to perform the method of any of the above mentioned embodiments.

The computer readable medium or storage medium may be a built-in medium installed inside a computer device main body or a removable medium arranged so that it may be separated from the computer device main body. The term computer-readable medium, as used herein, does not encompass transitory electrical or electromagnetic signals propagating through a medium (such as on a carrier wave), the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices), volatile memory devices (including, for example static random access memory devices or a dynamic random access memory devices), magnetic storage media (including, for example an analog or digital magnetic tape or a hard disk drive), and optical storage media (including, for example a CD, a DVD, or a Blu-ray Disc). Examples of the media with a built-in rewriteable non-volatile memory, include but are not limited to memory cards, and media with a built-in ROM, including but not limited to ROM cassettes, etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave), the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices), volatile memory devices (including, for example static random access memory devices or a dynamic random access memory devices), magnetic storage media (including, for example an analog or digital magnetic tape or a hard disk drive), and optical storage media (including, for example a CD, a DVD, or a Blu-ray Disc). Examples of the media with a built-in rewriteable non-volatile memory, include but are not limited to memory cards, and media with a built-in ROM, including but not limited to ROM cassettes, etc. Furthermore, various information regarding stored images, for example, property information, may be stored in any other form, or it may be provided in other ways.

The systems and methods described in this application may be partially or fully implemented by a special purpose computer created by configuring a general-purpose computer to execute one or more particular functions embodied in computer programs. The functional blocks and flowchart elements described above serve as software specifications, which may be translated into the computer programs by the routine work of a skilled technician or programmer. The computer programs include processor-executable instructions that are stored on at least one non-transitory computer-readable medium.

The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scale, Eiffel, Smalltalk, Erlangen, Ruby, Flash®, Visual Basic®, Lua, and Python®.

Example embodiments being thus described, it will be obvious that the same may be varied in many ways. Such variations are not to be regarded as a departure from the spirit and scope of inventive concepts, and all such modifications as would be obvious to one skilled in the art are intended to be included within the scope of the following claims.

Advantages of the Present Disclosure

The present disclosure provides system and method for generating and visualizing an interior design pertaining to a floor plan in a three-dimensional representation.

The present disclosure provides system and method for generating and visualizing an interior design pertaining to a floor plan in a three-dimensional representation based on techniques that are time effective and less cumbersome.

The present disclosure provides system and method for generating and visualizing an interior design pertaining to a floor plan in a three-dimensional representation that provides enhanced performance and reliability as compared to existing solutions.

The present disclosure provides system and method for generating and visualizing an interior design pertaining to a floor plan in a three-dimensional representation that can allow user-based customization.

I claim:

1. A system for generating and visualizing an interior design pertaining to a floor plan in a three-dimensional representation, the system comprising:
    a non-transitory storage device having embodied therein one or more routines operable to generate the three-dimensional representation of the interior design pertaining to the floor plan; and
    one or more processors coupled to the non-transitory storage device and operable to execute the one or more routines, wherein the one or more routines include:
        a two-dimensional image receive module, which when executed by the one or more processors, receives a two-dimensional input image pertaining to the floor plan, wherein the floor plan comprises at least one defined space;
        a shape determination module, which when executed by the one or more processors, determines a bounded region of the at least one defined space by performing region expansion based on a Fast Library for Approximate Nearest Neighbors (FLANN) based range search emanating from a seed point pertaining to the at least one defined space, and determines a shape of the at least one defined space by filling a plurality of pixels of the bounded region with a reference pixel value and performing geometric extraction of the bounded region based on contour detection;
        an object position determination module, which when executed by the one or more processors, computes one or more parameters of the at least one defined space and determines a position of one or more objects in the at least one defined space based on the one or more parameters and an annotation of the at least one defined space, wherein the position of the one or more objects is determined based on a set of pre-determined design assumptions obtained using neural networks;
        an object placement module, which when executed by the one or more processors, places the one or more objects from a pre-built library according to the determined position of the one or more objects in the at least one defined space, wherein the placement of the one or more objects is based on developing Gaussian normal distributions based on any or a combination of dimensions of the one or more objects and dimensions of the at least one defined space; and
        a three-dimensional representation generation module, which when executed by the one or more processors, generates a three-dimensional representation of the interior design pertaining to the floor plan based on placement of the one or more objects in the at least one defined space.

2. The system of claim 1, wherein the two-dimensional image receive module receives any or a combination of the annotation and the seed point pertaining to the at least one defined space.

3. The system of claim 1, wherein the shape determination module processes the two-dimensional input image to obtain a binary image, and wherein determination of the bounded region is performed based on the binary image.

4. The system of claim 3, wherein in case the bounded region is not determined by performing determination of the bounded region based on the two-dimensional input image, the shape determination module performs said determination based on the binary image.

5. The system of claim 1, wherein the shape determination module fixes convexity defects of the at least one defined space by computing convex hulls.

6. The system of claim 1, wherein the one or more parameters include any or a combination of size of the at least one defined space, lengths of edges of the at least one defined space, location of the at least one defined shape in the floor plan, position of connectives in the at least one defined space, and cardinal directions.

7. The system of claim 1, wherein the object position determination module fetches the set of pre-determined design assumptions from a design engine.

8. The system of claim 1, further comprising an object optimization module to perform optimization of the one or more attributes of the one or more objects, wherein the one or more attributes comprise any or a combination of geometric attributes, optical attributes and structural attributes of the one or more objects.

9. The system of claim 1, further comprising an interactive visualization and editor module to allow a user to modify the generated three-dimensional representation of the interior design.

10. A method comprising the steps of:
    receiving, by one or more processors, a two-dimensional input image pertaining to a floor plan, wherein the floor plan comprises at least one defined space;
    determining, by the one or more processors, a bounded region of the at least one defined space by performing region expansion based on Fast Library for Approximate Nearest Neighbors (FLANN) based range search emanating from a seed point pertaining to the at least one defined space;
    determining, by the one or more processors, a shape of the at least one defined space by filling a plurality of pixels of the bounded region with a reference pixel value and performing geometric extraction of the bounded region based on contour detection;
    computing, by the one or more processors, one or more parameters of the at least one defined space and determining a position of one or more objects in the at least one defined space based on the one or more parameters and an annotation of the at least one defined space, wherein the position of the one or more objects is determined based on a set of pre-determined design assumptions obtained using neural networks;
    placing, by the one or more processors, the one or more objects from a pre-built library according to the determined position of the one or more objects in the at least one defined space, wherein the placement of the one or more objects is based on developing Gaussian normal distributions based on any or a combination of dimensions of the one or more objects and dimensions of the at least one defined space; and
    generating, by the one or more processors, a three-dimensional representation of an interior design pertaining to the floor plan based on placement of the one or more objects in the at least one defined space.

* * * * *